Aug. 17, 1965

J. E. LASCHENSKI 3,201,726

TUNING APPARATUS

Filed Sept. 2, 1960

INVENTOR.
JOSEPH E. LASCHENSKI
BY
Albert H. Chanland
ATTORNEY

United States Patent Office 3,201,726
Patented Aug. 17, 1965

3,201,726

TUNING APPARATUS

Joseph E. Laschenski, Philadelphia, Pa., assignor, by mesne assignments, to Philco Corporation, Philadelphia, Pa., a corporation of Delaware Filed Sept. 2, 1960, Ser. No. 53,773
7 Claims. (Cl. 334—29)

This invention relates to tuning apparatus, and more particularly to apparatus for tuning electronic devices to desired frequency ranges. Specifically the invention has to do with apparatus for controlling the operation of and effecting fine tuning in television channel selectors or tuners.

Tuners of popular type employed in television receivers usually comprise channel selecting means and fine tuning means, the selecting means serving to tune the receiver roughly to a desired channel and the fine tuning means serving to tune the receiver precisely to the selected channel.

It has recently become the prevailing practice to utilize so-called "remote" tuning systems for effecting the selection of television channels in the operation of television receivers. This practice has brought about difficulties and problems particularly with respect to fine tuning. Generally, while remote tuning systems make it possible to select a channel by actuating control means at a distance from the receiver, in many instances it is still necessary to adjust the fine tuning means at the receiver itself when changing from one channel to another.

For that reason, the usefulness of remote tuning is seriously impaired, and it is therefore an object of this invention to overcome the difficulties and problems which are encountered when operating the tuner of a television receiver by remote control means.

A further and more specific object of the invention is to insure the full advantages of remote tuning by providing improved tuner mechanism which can initially be set in adjusted position so that accurate tuning to television station channels selected through actuation of remote control means is obtained without readjustment of fine tuning means.

It is also an object of the invention to provide simplified mechanism for accomplishing fine tuning simultaneously with the selection of desired station channels.

The invention is particularly characterized by the fact that it provides tuning apparatus which, after initial adjustment, can be remotely controlled for sequential movement to successive tuning positions to effect selection of desired station channels, with automatic fine tuning for each selected channel, as well as with automatic skipping of those tuning positions corresponding to station channels which are not available in the region where the receiver is located or which are available but unwanted by the user.

To these general ends, the invention in its preferred embodiment employs a channel selector member which is adapted to move step-by-step through predetermined increments. The selector member is provided with means having a plurality of fine tuning elements which represent a plurality of television station channels and which are adjustable individually to effect tuning of a television receiver exactly to the channel represented by the corresponding element. In accordance with the invention, the selector member is motor-driven and each fine tuning element can be adjusted to serve as means for controlling the driving motor so that it uninterruptedly drives the selector member past the station channel position represented by that particular element.

The nature of the invention, as well as its objects and advantages, will be more fully understood from the following description based on the accompanying drawing, in which.

Figures 1, 2, 3, 4:
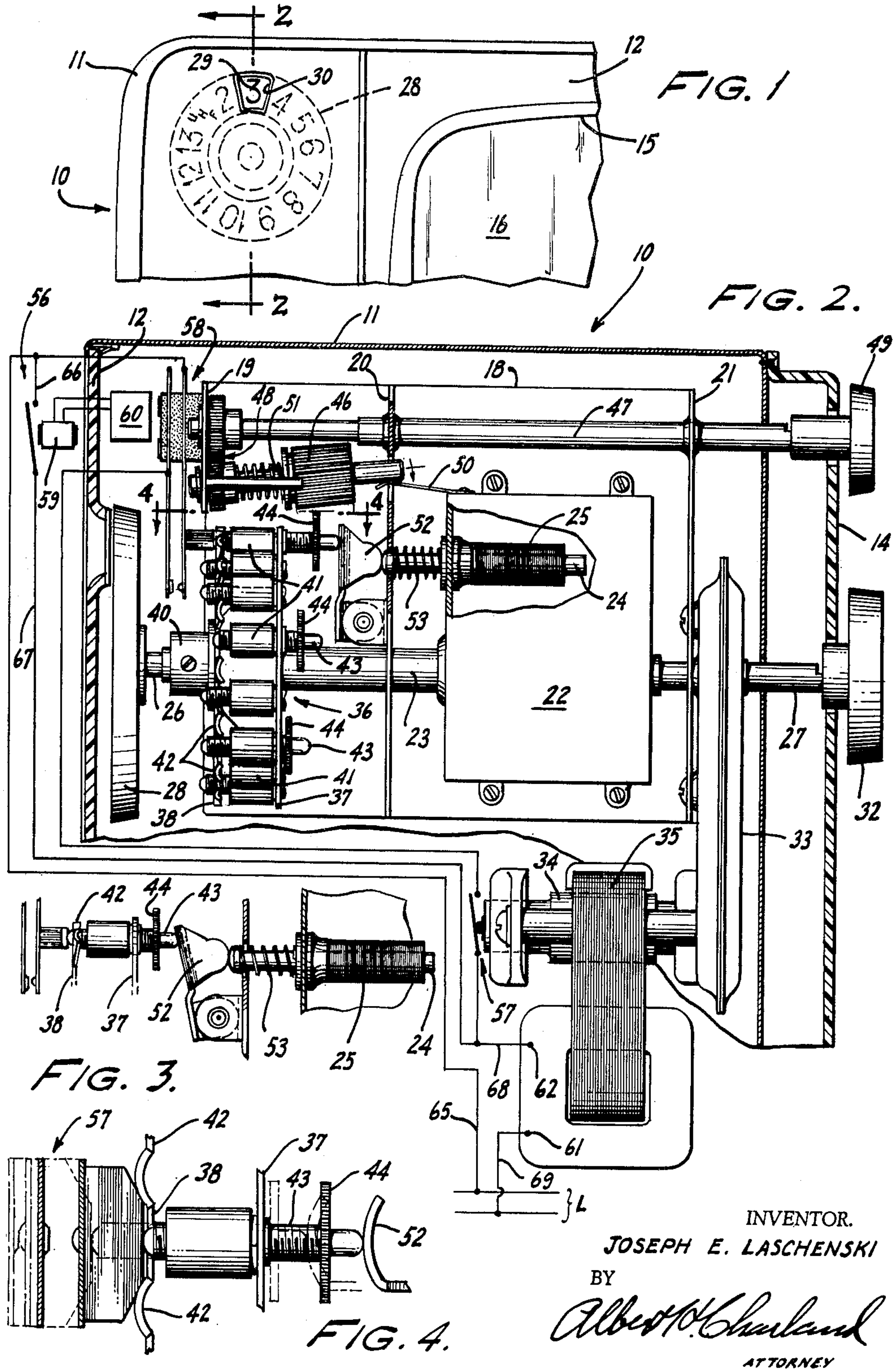
FIGURE 1 is a front elevational view of a portion of a television receiver provided with tuning apparatus incorporating the principles of the present invention.
FIGURE 2 is an enlarged sectional-elevational view looking in the direction indicated by arrows 2—2 of FIGURE 1, and illustrating cooperatively associated elements of the tuning apparatus in one operative position.
FIGURE 3 is a fragmentary view in which the cooperatively associated elements of the apparatus illustrated in FIGURE 2 are shown in another operative position.
FIGURE 4 is an enlarged fragmentary view looking in the general direction of arrows 4—4 of FIGURE 2, and representing the manner in which elements of the illustrated apparatus cooperate in accordance with the invention.

Having more particular reference to FIGURES 1 and 2 of the drawing, there is shown a television receiver cabinet 10 of conventional design including an outer shell 11, a front wall panel 12 and a rear wall panel 14. The front wall panel is provided with the usual viewing opening 15 which is fitted with a transparent protective shield 16.

As seen in FIGURE 2, the cabinet encloses a chassis member 18 provided with bearing brackets 19, 20, and 21, and carrying a channel selector or tuner 22. This channel selector or tuner may be of any suitable known type and, in the illustrated embodiment, is preferably of the conventional rotary switch variety in which pretuned circuit elements (not shown) are carried by and rotatable with a shaft 23 through successive tuning positions, to effect station channel selection and in which a variable inductance having a core or slug 24 slidable in a fixed coil 25 is employed to effect fine tuning to a selected station channel.

As shown in FIGURE 2, the selector or tuner shaft 23 has a forwardly extending end portion 26 and a rearwardly extending end portion 27. The forwardly extending end portion 26 of said shaft passes through the bearing bracket 20 of the chassis member 18 and carries a dial 28. This dial is rotatable with the shaft 23 and as illustrated in FIGURE 1, has an appropriate channel-designating scale 29 disposed to cooperate with a window 30 in the front wall panel 12 of the cabinet to provide visual indication of the selected station channel. The other or rearwardly extending end portion 27 of the shaft 23 passes through the bearing bracket 21 of the chassis member and carries a knob 32 which lies outside the rear wall panel 14 where said knob is accessible to effect manual rotation of the selector or tuner shaft 23, which shaft is also adapted to be power driven through a conventional gear reduction unit 33 coupled to the rotor 34 of an electric motor 35. The motor is of the well known type in which the rotor is axially movable in response to energization and deenergization of said motor.

In particular accordance with the invention, a turret or channel indexing structure 36 is adapted to serve both as means for effecting programming of television stations and as means for effecting fine tuning to a selected station channel. This structure 36 is mounted on the selector shaft 23 between the channel selector or tuner 22 and the channel indicator dial 28. As shown, the structure 36 includes a pair of plates 37 and 38 affixed concentrically on a hub 40 received upon and rigidly attached to the selected shaft 23.

The plate 37 which faces in the direction of the tuner 22 is provided with tubular stems or sleeves 41 which are axially aligned with openings defined by adjacent radial tabs or fingers 42 formed on the other plate which faces in the direction of the dial 28. Screw-threaded elements or pins 43 are received in said studs or sleeves, each of said elements or pins being of a length sufficient to extend traversely past the sides of the turret structure. These screw-threaded elements or pins 43 fixedly carry gears 44 and are so disposed that adjoining gears clear each other when their associated elements or pins are moved lengthwise in sleeves 41 of the turret structure. The gears 44 are adapted to be successively brought, through step-by-step rotation of the selector shaft 23, in a position to be drivingly engaged by a rotatable pinion 46 located adjacent the periphery of the turret structure and journalled in the bearing bracket 20 of the chassis member 18.

As seen in FIGURE 2, rotation of the pinion 46 is accomplished by rotation of an auxiliary shaft 47 through intermeshing gearing 48. The shaft 47 is rotatably supported in the bearing brackets 19, 20 and 21 of the chassis member and is provided with a manipulating knob 49 accessible from the outside of the rear wall panel 14 of the cabinet. The pinion 46 is normally displaced with respect to the gears 44 so as not to interfere with the rotation of the turret structure 36 when driven by the tuner shaft 23. For that purpose and as shown in FIGURE 2, the pinion is resiliently raised to a tilted inoperative position by means of a spring 50. The pinion remains in that position until the rotational force developed through the intermeshing gearing 48 by rotation of the auxiliary shaft 47 causes said pinion to move to operative position (the position represented in broken lines in FIGURE 2) by reason of reacting abutments 51.

Because of the construction described above, it will be understood that any one of the pins 43 can be moved in or out of the turret structure through rotation of the pinion 46 thus adjusting the location of the pin with respect to a lever 52 which is pivotally supported on the bearing bracket 20 and abuts the adjacent spring reacting end 53 of the fine tuning slug 24. In this manner each pin 43 can be adjusted in exact position to effect fine tuning of the station channel which it represents when the shaft 23 and turret structure 36 are rotated as a unit by the motor 35.

In the illustrated embodiment the motor is governed by function of switches 56, 57, and 58 in the motor circuit. The switch 56 is normally open and is adapted to be momentarily closed by means of a relay 59 which can and preferably is excited through operation of remote control responding circuitry designated generally at 60; the switch 57 is also normally open and is adapted to be closed by the rotor 34 of the motor when said rotor moves from its inoperative position to its operative position as mentioned above; and the switch 58 which is also normally open, is adapted to be closed by any one of the pins 43 when adjusted to project outwardly past the plate 38 of the turret and set to engage said switch. As diagrammatically represented in FIGURE 2, a terminal 61 of the motor is connected to one side of an electrical energy supply line L, and another terminal 62 of the motor is connected to the other side of said line either through the relay-operated switch 56 or through the motor-operated switch 57 and the turret-operated switch 58.

In operation, the switch 56 is a drive initiating switch, and switches 57 and 58 are holding switches, switch 58 serving also as a programming switch as will more clearly appear from the description to follow. As can be seen from the circuit diagram in FIGURE 2, channel selection is obtained by exciting the relay 59 to close the switch 56 which in turn closes the motor circuit from one side of the line through conductors 65, 66, 67, 68 and the motor terminals 62, and from the other side of the line through conductor 69 and the motor terminal 61. Thus the motor is energized, causing the switch 57 to close, through translation of the rotor, and imparting rotation to the selector shaft 23, the latter in turn driving the turret structure 36 to bring a new pin 43 in operative position between the lever 52 and the programming switch 58. Should this new pin be one which has been preset to project laterally from the turret plate 38 to engage and close the switch 58, then the motor will continue to be energized through the aforesaid holding switches 57 and 58 and to drive the selector shaft 23 and turret structure 36 through to the succeeding step or increment, thus bringing the next pin in the above-mentioned operative position. If however this latter pin should be one pre-adjusted to clear the switch 58, then said switch will be open, the motor will be deenergized and the tuner shaft 23 will be idle. In such event, the pin brought to and remaining in the aforesaid operative position would represent a station channel and the receiver would be fine-tuned to that channel since said pin would have previously been adjusted by means of the pinion 46 in the manner stated above to engage the lever 52 for actuating the tuning slug 24.

From the foregoing description, it will be appreciated that the invention provides simplified apparatus whereby fine tuning is automatically accomplished while remotely selecting a desired frequency or station channel, and whereby tuning positions which correspond to unavailable or undesired channels can be by-passed automatically while making such selection. In this manner the invention has the advantage that the user obtains an available desired station channel at each actuation of the remote control means.

While a preferred embodiment of the invention has been illustrated it will be understood that the invention is not necessarily limited to that embodiment and embraces such changes and modifications as come within the scope of the appended claims.

What I claim is:

1. Tuning apparatus comprising channel selecting means including a shaft mounted for progressive step-by-step rotation to select a plurality of station channels successively, tuning means including a member displaceable for effecting fine tuning to the selected channels, an electric motor drivingly connected to said shaft to rotate the same, a turret structure connected to said shaft and rotatable with respect to said member, circuit means for supplying electrical energy to said motor and including a switch disposed adjacent said structure, said structure having a plurality of screw-threaded rotatable elements representing said channels, one end portion of each of said elements being adapted for engagement with said tuning member, the other end portion of each of said elements being adapted for engagement with said switch, and means for rotatably adjusting said elements individually either in positions for engagement of said one end portion with said tuning member for fine tuning adjustments thereof or in positions for engagement of said other end portion with said switch to operate the same.

2. Tuning apparatus comprising a selector member for progressive step-by-step movement to effect sequential selection of a plurality of station channels, a tuning member operable to effect fine tuning to the selected channels, a channel-indexing structure connected to said selector member and movable with respect to said tuning member, electric motor means having a rotor for driving said selector member and structure, said rotor being axially movable in response to energization and deenergization of said motor means, circuit means for supplying electrical energy to said motor means and including two series connected switches, one of said switches being disposed adjacent said rotor to be operated thereby in response to axial movement thereof, the other of said switches being disposed adjacent said structure, said structure having a plurality of adjustably mounted elements representing said channels, and means for adjusting said elements individually either to engage said tuning member for fine tuning adjustments thereof or to engage said switch to operate the same.

3. Tuning apparatus comprising a selector member adapted for progressive step-by-step movement to effect sequential selection of a plurality of station channels, a tuning member operable to effect fine tuning to the selected channels, a channel-indexing structure connected to said selector member and movable with respect to said tuning member, electric motor means having a rotor for driving said selector member and structure, said rotor being axially movable in response to energization and deenergization of said motor means, circuit means for supplying electrical energy to said motor means and including a starting switch and two holding switches, a remote control relay for operating said starting switch, one of said holding switches being disposed adjacent said rotor to be operated thereby in response to axial movement thereof, the other holding switch being disposed adjacent said structure, said structure having a plurality of adjustably mounted elements representing said channels, and means for adjusting said elements individually either to engage said tuning member for fine tuning adjustments thereof or to engage said other holding switch to operate the same.

4. Tuning apparatus comprising a selector member adapted for progressive step-by-step movement to effect sequential selection of a plurality of station channels, a tuning member operable to effect fine tuning to the selected channels, a channel-indexing structure connected to said selector member and movable with respect to said tuning member, electric motor means having a rotor for driving said selector member and structure, said rotor being axially movable in response to energization and deenergization of said motor means, circuit means for supplying electrical energy to said motor means and including two series-connected switches, one of said switches being disposed adjacent said rotor to be operated thereby in response to axial movement thereof, the other of said switches being disposed adjacent said structure, said structure having a plurality of adjustably mounted elements representing said channels, one end portion of each of said elements being adapted to engage said tuning member, the other end portion of each of said elements being adapted to engage said other switch, and means for adjusting said elements individually either in positions for engagement of said one end portion with said tuning member for fine tuning adjustments thereof or in positions for engagement of said other end portion with said other switch to close the same.

5. Tuning apparatus comprising a selector member adapted for progressively step-by-step movement to effect sequential selection of a plurality of station channels, a tuning member operable to effect fine tuning to a selected channel, a channel-indexing structure connected to said selector member and movable with respect to said tuning member, electric motor means having a rotor for driving said selector member and structure, said rotor being axially movable in response to energization and deenergization of said motor means, circuit means for supplying electrical energy to said motor means and including a starting switch and two holding switches, a remote control relay for operating said starting switch, one of said holding switches being disposed adjacent said rotor to be operated thereby in response to axial movement thereof, the other holding switch being disposed adjacent said structure, said structure having a plurality of screw-threaded rotatable elements representing said channels, one end portion of each of said elements being adapted to engage said tuning member, the other end portion of each of said elements being adapted to engage said other of said holding switches, and means for rotatably adjusting said elements individually either in positions for engagement of said one end portion with said tuning member for fine tuning adjustments thereof or in positions for engagement of said other end portion with said other holding switch to operate the same.

6. In combination in a television receiver; a tuner having a shaft; a rotary channel selector for tuning to a predetermined frequency at preselected positions of said channel selector; mechanical means sequentially positioning said selector in said preselected positions; a motor drivingly coupled to said shaft and a source of power for said motor; program means maintaining said motor energized between adjacent preselected positions of said channel selector and deenergizing said motor in each said preselected position; said program means including a program switch connected between said motor and said source of power; momentary contact switch means initiating operation of said motor; circuit means, including an impedance having a movable element for varying the value of said impedance cooperating with said rotary channel selector to provide optimum tuning at each said preselected position; means coupled to said shaft for rotation therewith and carrying a plurality of adjustment elements, each of said plurality of adjustment elements being individual to a corresponding preselected position of said channel selector, rocker arm means sequentially coupling said adjustable elements to said movable element; means for manually setting each adjustment element in each said preselected position; said program switch being unaffected by said adjustment elements, when positioned in one portion of their adjustment ranges and being responsive to said adjustment elements, when positioned in a second portion of their adjustment ranges to maintain said motor energized in corresponding preselected positions whereby said channel selector is not stopped in said corresponding preselected positions.

7. In combination in a television receiver: a tuner having a shaft; a rotary channel selector for tuning to a predetermined frequency at preselected positions of said channel selector; mechanical means sequentially positioning said selector in said preselected positions; a motor drivingly coupled to said shaft and a source of power for said motor; program means maintaining said motor energized between adjacent preselected positions of said channel selector and de-energizing said motor in each said preselected position; said program means including a program switch connected between said motor and said source of power; momentary contact switch means initiating operation of said motor; circuit means, including an impedance having a movable element for varying the value of said impedance cooperating with said rotary channel selector to provide optimum tuning at each said preselected position; means coupled to said shaft for rotation therewith and carrying a plurality of adjustment elements; each of said plurality of adjustment elements being individual to a corresponding preselected position of said channel selector; rocker arm means sequentially coupling said adjustable elements to said movable element; means for manually setting each adjustment element in each said preselected position; said program switch being unaffected by said adjustment elements, when positioned in one portion of their adjustment ranges and being responsive to said adjustment elements, when positioned in a second portion of their adjustment ranges to maintain said motor energized in corresponding preselected positions whereby said channel selector is not stopped in said corresponding preselected positions.

References Cited by the Examiner

UNITED STATES PATENTS

| | | | |
|---|---|---|---|
| 2,816,259 | 12/57 | Papitto. | |
| 2,956,161 | 10/60 | Cady. | |
| 2,965,829 | 12/60 | Lingenbrink et al. | |
| 2,981,838 | 4/61 | Poskozim. | |
| 3,136,966 | 6/64 | Lindeman et al. -------- | 334—29 |

FOREIGN PATENTS

| | | |
|---|---|---|
| 160,318 | 3/41 | Austria. |

HERMAN KARL SAALBACH, *Primary Examiner.*

SAMUEL B. PRITCHARD, ELI LIBERMAN, *Examiners.*